United States Patent [19]

Murdock et al.

[11] Patent Number: 5,239,261

[45] Date of Patent: Aug. 24, 1993

[54] PROBE APPARATUS FOR TESTING ELECTRONIC CIRCUITS IMMERSED IN A LIQUID CRYOGEN

[75] Inventors: Bruce Murdock, Beaverton; Norman T. Forrest, Portland, both of Oreg.

[73] Assignee: Tektronix, Inc., Wilsonville, Oreg.

[21] Appl. No.: 826,355

[22] Filed: Jan. 27, 1992

[51] Int. Cl.[5] .................... G01R 35/00; G01R 31/06
[52] U.S. Cl. .......................... 324/158 P; 324/158 F
[58] Field of Search ............ 324/158 F, 158 P, 72.5, 324/690, 685; 73/32 R; 165/80.4, 80.5; 361/385

[56] References Cited

U.S. PATENT DOCUMENTS

| | | | |
|---|---|---|---|
| 3,710,251 | 1/1973 | Hagge et al. | 324/158 P |
| 3,984,222 | 10/1976 | DeHaan | 165/179 |
| 4,897,762 | 1/1990 | Daikoku et al. | 361/385 |
| 4,950,181 | 8/1990 | Porter | 361/385 |
| 4,954,774 | 9/1990 | Binet | 324/158 P |
| 4,982,153 | 1/1991 | Collins et al. | 324/158 P |

*Primary Examiner*—Vinh Nguyen
*Attorney, Agent, or Firm*—John D. Winkelman; John Smith-Hill

[57] ABSTRACT

A mechanical holder for receiving an integrated circuit chip and an etched circuit board probe and holding them in predetermined relative positions includes an alignment block including alignment elements and having a main surface against which the probe is positioned, and a chip receiver having a main surface and including alignment elements that are complementary to the alignment elements of the alignment member. The chip receiver is attached to the alignment member with the main surface of the chip receiver in confronting relationship with the main surface of the alignment member and with the alignment elements of the chip receiver in registration with the alignment elements of the alignment member. The chip receiver defines a cavity that opens at its main surface. A pusher block is fitted in the cavity of the chip receiver in a manner permitting translation of the pusher block perpendicular to the main surface of the chip receiver and also permitting limited tilting movement of the pusher block in the cavity about at least one axis parallel to the main surface of the chip receiver. A spring urges the pusher block towards the alignment member when the chip receiver is attached to the alignment member.

14 Claims, 3 Drawing Sheets

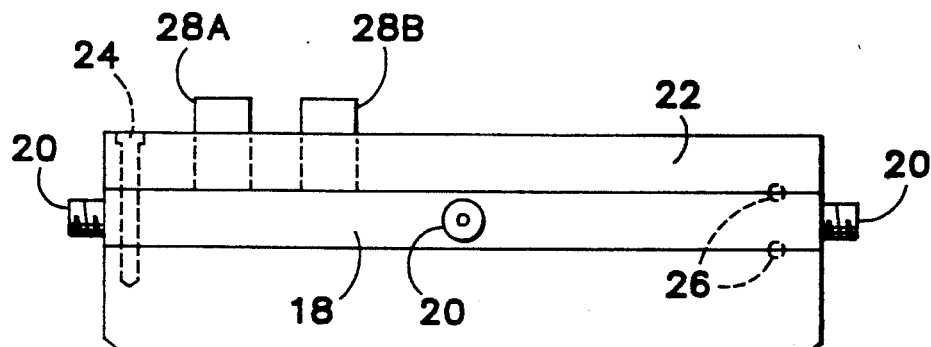
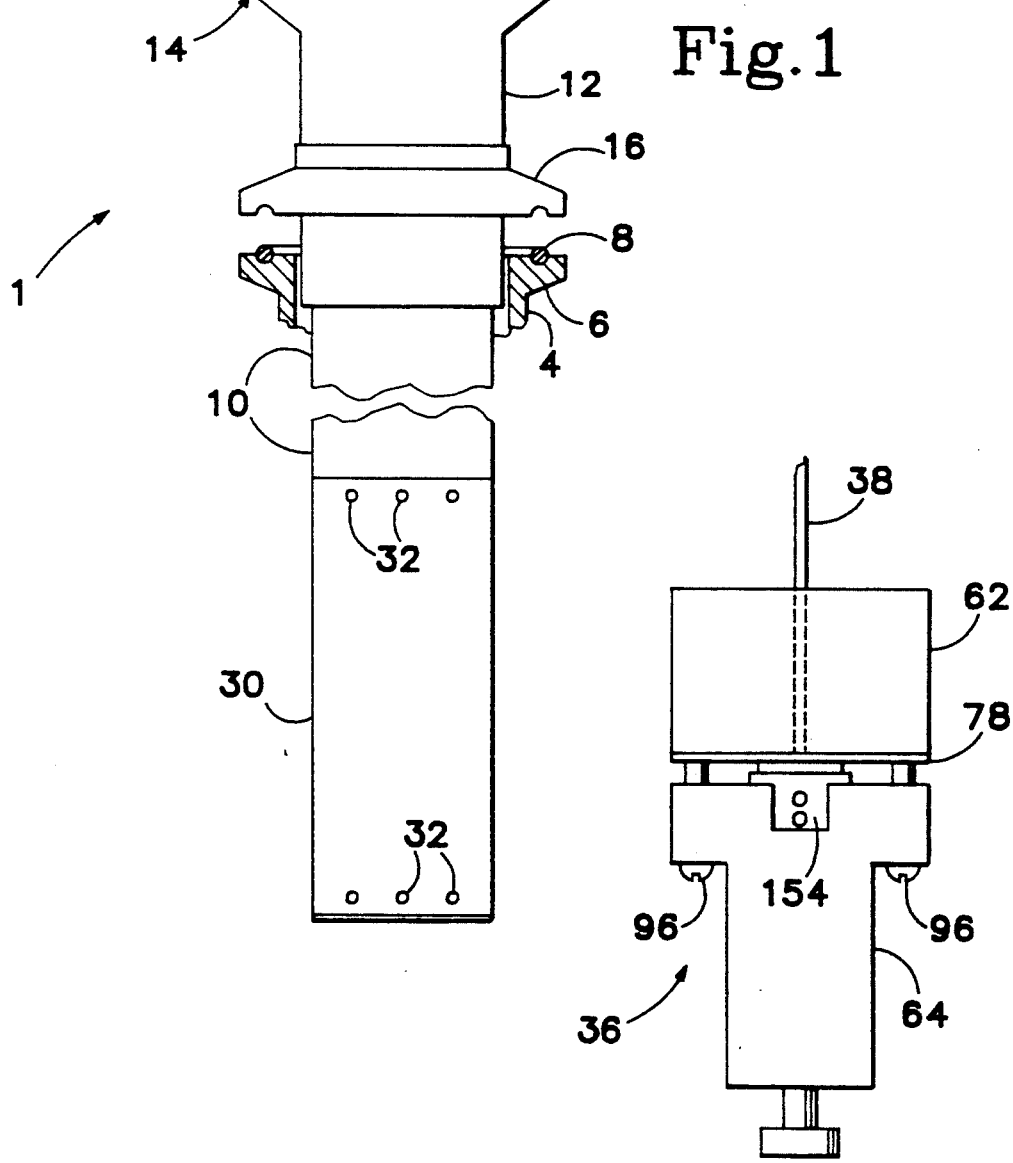
Fig.1
Fig.2

PROBE APPARATUS FOR TESTING ELECTRONIC CIRCUITS IMMERSED IN A LIQUID CRYOGEN

BACKGROUND OF THE INVENTION

This invention relates to probe apparatus for testing electronic circuits.

Apparatus for testing an integrated circuit generally comprises a test and measurement instrument that generates test signals for application to a device under test (DUT) and monitors response signals provided by the DUT, a mechanical holder for holding the DUT in a predetermined position, and a probe that is received by the mechanical holder and serves as an electrical interface between the test and measurement instrument and DUT. The probe has terminals that are connected to the test and measurement instrument and contact elements that are brought into pressure contact with contact pads of the DUT.

An integrated circuit that is intended to operate at a cryogenic temperature (below 100 K) must be tested at a cryogenic temperature. This may be done immersing the mechanical holder and the DUT in a liquid cryogen. Since the DUT and the mechanical holder may undergo a temperature change of about 290 K when they are immersed in the liquid cryogen, the design of the mechanical holder must take account of thermal contraction and must ensure that the pressure contact between the contact elements of the probe and the contact pads of the DUT is not impaired through change in temperature.

SUMMARY OF THE INVENTION

According to a first aspect of the present invention there is provided a mechanical holder for receiving an integrated circuit chip and an etched circuit board probe and holding them in predetermined relative positions. The mechanical holder comprises an alignment member including alignment elements and having a main surface against which the probe is positioned, and a chip receiver having a main surface and including alignment elements that are complementary to the alignment elements of the alignment member. The mechanical holder also comprises attachment means for attaching the chip receiver to the alignment member with the main surface of the chip receiver in confronting relationship with the main surface of the alignment member and with the alignment elements of the chip receiver in registration with the alignment elements of the alignment member. The chip receiver defines a cavity that opens at its main surface. A pusher block is fitted in the cavity of the chip receiver in a manner permitting translation of the pusher block perpendicular to the main surface of the chip receiver and also permitting limited tilting movement of the pusher block in the cavity about at least one axis parallel to the main surface of the chip receiver. Resiliently yieldable means urge the pusher block towards the alignment member when the chip receiver is attached to the alignment member.

According to a second aspect of the present invention there is provided a probe apparatus for testing an electronic circuit at a cryogenic temperature by immersion in a liquid cryogen contained in a vessel having a substantially circular flange surrounding an opening that gives access to the interior of the vessel. The probe apparatus comprises a mechanical holder for receiving a device under test and an etched circuit probe and holding them in predetermined relative positions, a mounting tube having two opposite ends, means for supporting the mechanical holder relative to the mounting tube at one end thereof, a transition member attached to the mounting tube at the opposite end thereof, signal transmission means extending within the mounting tube from the transition member to the mechanical holder for transmitting electrical signals between a device under test and a test and measurement instrument, and a bushing member attached to the mounting tube for engaging in sealing fashion the flange of the vessel containing liquid cryogen.

BRIEF DESCRIPTION OF THE DRAWINGS

For a better understanding of the invention, and to show how the same may be carried into effect, reference will now be made, by way of FIG. 1 is a partial elevational view of probe apparatus embodying the present invention, FIG. 2 is a side elevation to an enlarged scale of a mechanical holder that forms part of the probe apparatus.

Figure 3:
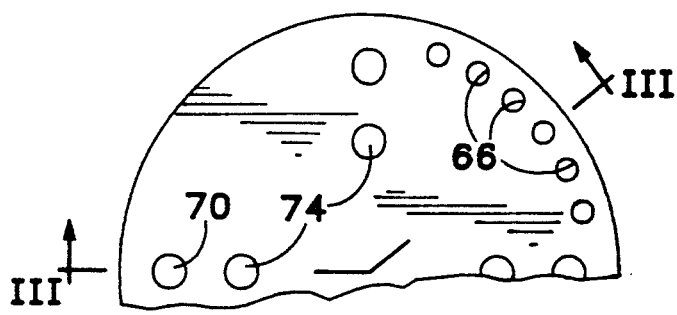
FIG. 3 is an enlarged partial bottom plan view of an alignment block that forms part of the mechanical holder shown in FIG. 2.

Words of orientation that are used in the following Detailed Description, such as upper and lower, relate to orientation when the probe apparatus is in use, and are not intended to imply that the particular element is always in that orientation. Thus, the "lower surface" of the alignment block referred to below might sometimes be the top surface of the alignment block, and at other times that surface might be vertically disposed.

DETAILED DESCRIPTION

FIG. 1 shows probe apparatus 1 designed for use in conjunction with a standard liquid helium dewar, having a neck 4 that terminates at its upper end in a flange 6 equipped with an O-ring 8. The probe apparatus comprises a tube 10, which is of uniform diameter and is sized to extend through the opening defined by the neck of the dewar. The tube is preferably made of glass fiber and epoxy composite material, because it has a low thermal conductivity and is non-magnetic. However, other materials, such as stainless steel, may be used instead.

At its upper end, the tube 10 is fitted into the neck 12 of a funnel 14. The neck 12 is provided at its interior with O-rings (not shown) that engage the exterior of the tube 10. At its exterior, the neck 12 carries a bushing member or mounting flange 16, which is threaded onto the neck. By rotating the flange 16 about the neck 12 in one sense, the O-rings at the interior of the neck are clamped onto the tube 10, thus gripping the tube 10 to the funnel 14 and providing a seal between the tube and the funnel, and by rotating the flange in the opposite sense the grip is released and the seal is broken.

The funnel 14 widens upwardly from its neck 12, and is provided at its upper end with an annular connector carrier 18. The connector carrier has twenty-four SMA connectors 20 equiangularly distributed about its periphery, but only three of the SMA connectors are shown in FIG. 1. Above the connector carrier 18 is a circular sealing plate 22. The sealing plate 22 is attached to the funnel 14 by screws 24, and O-rings 26 provide seals between the connector carrier 18 and both the funnel 14 and the sealing plate 22. The O-ring seals allow a superambient pressure to develop inside the dewar, and thereby maintain a low rate of boil-off of liquid helium. In order to limit the pressure inside the dewar, the sealing plate is provided with a pressure relief valve 28A, which opens at about 34 kN/m² above the ambient pressure, and with a back-up safety valve 28B, which opens at about 68 kN/m² above ambient pressure. The sealing plate is also provided with an electrical feed-through, the purpose of which will be described later, and with a fitting that allows the interior of the dewar to be pressurized, for example with nitrogen.

Before attaching the connector carrier and the sealing plate to the funnel, twenty-four lengths of coaxial cable, each comprising a center conductor, an insulator layer and a shield, are connected to the SMA connectors respectively and their opposite ends are prepared so that the insulator layer projects somewhat beyond the shield and the center conductor projects somewhat beyond the insulator layer. The cables are threaded through the funnel and the tube so that they project from the lower end of the tube. Assembly fixtures are employed to ensure that the cables remain in generally parallel relationship throughout the length of the tube. Care is taken to ensure that the cables are not bent through an excessive angle, such as might cause kinking of the shield.

At its lower end, the tube 10 is threadedly connected to a cover sleeve 30, which is closed at its lower end but is formed with ports 32 in its side wall. The ports allow liquid helium in the dewar to enter the cover sleeve 30 and the interior of the tube 10.

A mechanical holder 36, which is shown to an enlarged scale in FIG. 2, is located at the lower end of the tube 10 and is connected to the twenty-four coaxial cables. One of the coaxial cables, designated 38, is shown in FIG. 2.

Figure 4:
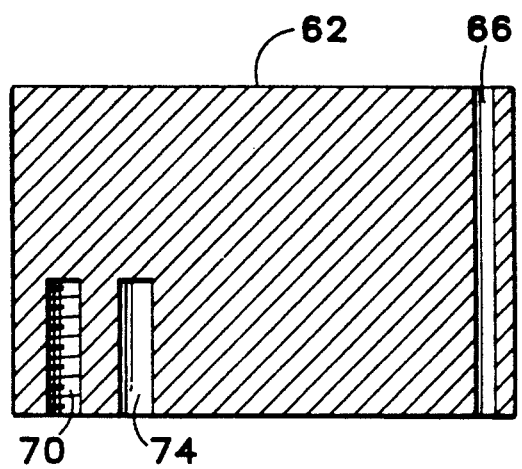
FIG. 4 is a sectional view taken on the line III—III of FIG. 3.

The mechanical holder 36 comprises an alignment block 62 and a chip receiver 64. The alignment block, which is also shown in FIGS. 3 and 4, is cylindrical and is formed with twenty-four parallel cylindrical bores 66 extending therethrough from one main face of the block to the opposite main face thereof. The twenty-four bores are in four groups of six, only one group being shown in FIG. 3, and the central axes of the bores lie on a cylinder that is coaxial with the cylindrical block. In each group of six bores, each two adjacent bores are separated by about 11 degrees about the central axis of the block.

In its lower surface, the alignment block 62 is formed with internally threaded holes 70 for receiving screws, and is also formed with bores 74 for receiving alignment pins.

The coaxial cables are received in respective bores 66 of the alignment block. The prepared end of each cable is inserted downwardly into one of the bores of the alignment block so that the end surface of the insulator layer is flush with the lower surface of the alignment block, and the center conductor then projects somewhat below the lower surface of the block. The shield is then bonded to the alignment block using conductive epoxy and cryogenic epoxy adhesives. The shields of the coaxial cables are grounded through the SMA connectors, and consequently the alignment block also is grounded.

An etched circuit board 78, which serves as a probe, is placed on the lower surface of the alignment block. The circuit board is described in detail in co-pending application Ser. No. 07/826,354 filed Jan. 27, 1992, the disclosure of which is hereby incorporated by reference herein. As more fully described in the co-pending application, the circuit board comprises a ring-like substrate of insulating material having a layer of copper on one main surface and conductor runs of beryllium copper on its other main surface. The circuit board is formed with center conductor holes adjacent its periphery, in a pattern corresponding to the pattern of center conductors projecting from the lower surface of the alignment block. The conductor runs extend from connection pads that are adjacent the center conductor holes respectively to contact bumps that are arranged along four sides of a square. The circuit board is also formed with mounting holes and alignment holes, which correspond in positioning to the holes 70 and 74 respectively in the alignment block. The circuit board is placed with the copper layer towards the lower surface of the alignment block and is positioned so that the projecting ends of the center conductors of the cables pass through the center conductor holes of the circuit board. By use of a suitable assembly fixture, pressure is applied to the circuit board to hold it firmly against the lower surface of the alignment block. An annular solder preform is placed over each of the projecting center conductors and is heated. In this fashion, the circuit board is attached to the alignment block and a good electrically conductive connection is provided between the center conductors and the conductor runs of the circuit board.

The chip receiver 64 has ears 92 that are formed with through holes 94 for receiving attachment screws 96. The chip receiver is also formed with blind bores 100 for receiving alignment pins 104 and with a cavity 108 for receiving a pusher block 110. The cavity 108 is square in cross section, and at its lower end it communicates with a bore 116 that is circular in cross section and is internally threaded.

A screw 120 is fitted threadedly in the bore 116. The screw 120 has a stem 122 that is narrower than the threaded portion 124 of the screw and extends beyond the threaded portion, so that a shoulder 126 is formed between the threaded portion of the screw and the stem. A still narrower pin 128 extends beyond the stem 122. A pressure member 130 has a sleeve 132 that fits over the pin 126 and also has an enlarged head portion 134 with a convexly curved upper surface. A compression spring 136 is threaded by the stem 122, pin 128 and sleeve 132, and is effective between the shoulder 126 and the enlarged head portion 134.

Figure 6:
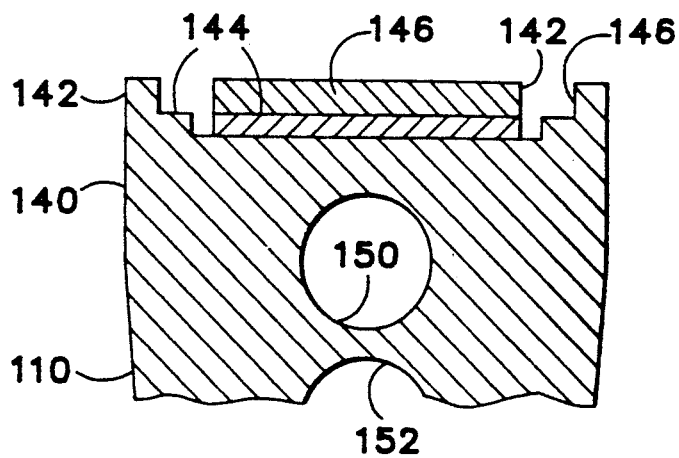
FIG. 6 is an enlarged sectional view of a pusher block.

The pusher block 110 is designed to fit in the cavity 108 in a manner such that it can tilt somewhat about horizontal axes and can be moved vertically within the cavity, but cannot move relative to the chip holder along horizontal axes and cannot rotate relative to the chip holder about vertical axes. This is achieved by forming the pusher block with a short band 140 over which its cross-sectional area is uniform and closely matches the cross sectional shape and size of the cavity 108. If the band is intermediate the top and bottom surfaces of the block, the pusher block tapers slightly from the band towards both the top surface and the bottom surface. Alternatively, as shown in FIG. 6, the band 140 might be at the top of the block, in which case the block tapers slightly toward the bottom surface.

The top surface of the pusher block has four locating ridges 142 along its four edges respectively. Each locating ridge is stepped. The treads 144 of the four stepped ridges define a seating surface for receiving a DUT, and the risers 146 that project upwardly from the treads serve to limit horizontal movement of the DUT. The pusher block is formed with a transverse bore 150 for receiving a heating resistor having two wires connected to its far and near ends respectively. The wire that is connected to the far end of the heating resistor passes through a second transverse bore 152 in the pusher block and the two wires pass together through a notch 154 (FIG. 2) in the chip receiver and also pass together through the tube 10 and the funnel 14 and are connected to the electrical feed-through on the sealing plate 22 (FIG. 1). The purpose of the heating resistor is to remove magnetic flux at cryogenic temperatures.

Figure 5:
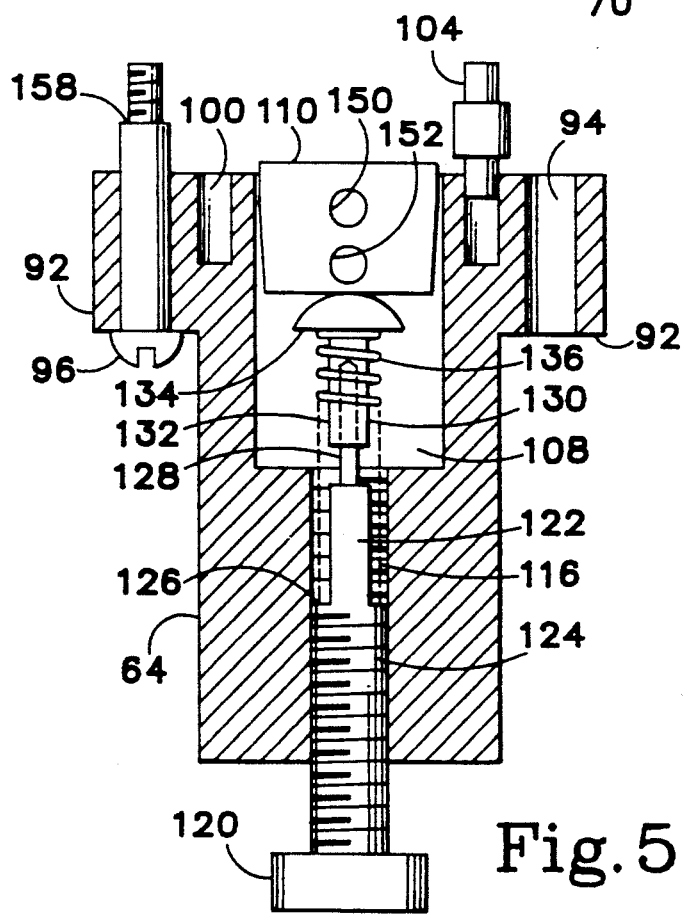
FIG. 5 is a side view, partly in elevation and partly in section, of a chip receiver that forms part of the mechanical holder shown in FIG. 2.

In order to assemble the chip receiver to the alignment block, the pusher block is placed on the head portion 134 of the pressure member 130 as shown in FIG. 5, and thermally conductive grease is placed in the recess bounded by the locating ridges 142 of the pusher block. The DUT is placed on its seating surface, and the grease adheres the DUT to the pusher block. At this point, the alignment block is positioned with its central axis generally horizontal and the chip receiver is in the orientation shown in FIG. 5. The chip receiver is then tilted to a horizontal orientation and its upper surface is presented to the alignment block. The close fit of the pusher block 110 in the cavity 108 prevents the pusher block from falling out of the cavity 108, and the adhesive action of the grease ensures that the DUT remains in position. The alignment pins 104 are inserted into the bores 74 and the chip receiver is attached to the alignment block by use of the screws 96. The screw 120 is then tightened somewhat to bring the DUT into contact with the probe, and the quality of the positioning of the DUT relative to the probe is determined by measuring the room temperature characteristics of the DUT.

The screws 96 have shoulders 158 that engage the circuit board 78 and hold the chip receiver spaced from the circuit board. This allows liquid cryogen to contact the DUT and also avoids the need to provide electrically insulating material between the chip receiver and the circuit board. Two screws are sufficient to attach the chip receiver to the alignment block, but in some applications four screws might be used. Of course, the attachment screws themselves serve also as alignment elements. If only two screws are used, they are placed adjacent opposite corners of the pusher block 110, and alignment pins 104 are fitted in the alignment holes adjacent the other two corners of the pusher block.

The alignment pins each comprise a larger diameter cylinder from which two coaxial smaller diameter cylinders project, as shown in FIG. 5, and one of the smaller diameter cylinders fits slidingly in the bore 100 while the other threads the hole 74 in the probe and enters the bore 74 in the alignment block. The larger diameter cylinder provides shoulders that maintain a predetermined spacing between the alignment block 62 and the chip receiver 64.

A natural rubber O-ring (not shown) is fitted around the four screws (or two screws and two alignment pins), and serves as an elastomeric cushion maintaining the probe 78 in firm contact with the alignment block over a greater area than can be achieved by the screws (and possible alignment pins) alone.

The assembly fixture that is used to apply pressure to the circuit board 78 prior to soldering to the center conductors of the coaxial cables is preferably identical to the chip receiver 64. During assembly, the natural rubber O-ring provides contact pressure forcing the circuit board into contact with the alignment block, so that the circuit board is in firm contact with the alignment block when it is soldered to the center conductors of the coaxial cables.

Figure 7:
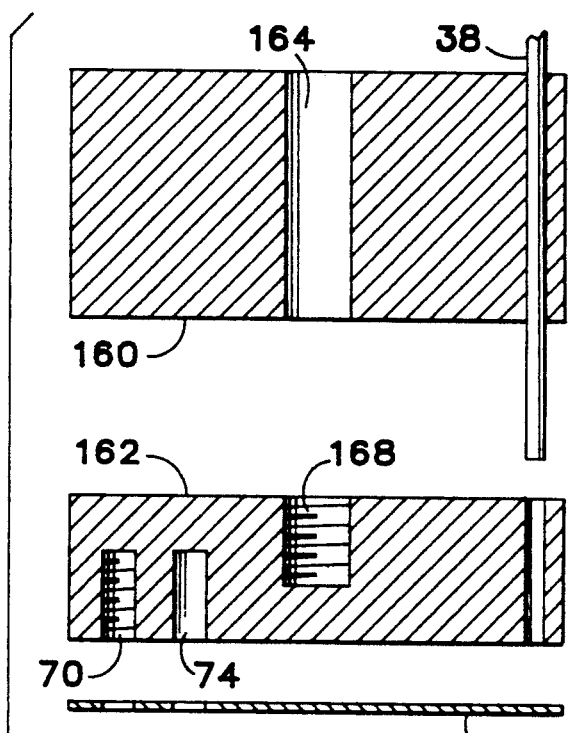
FIG. 7 is an exploded sectional view of an alternative construction of alignment block.
Figure 8:
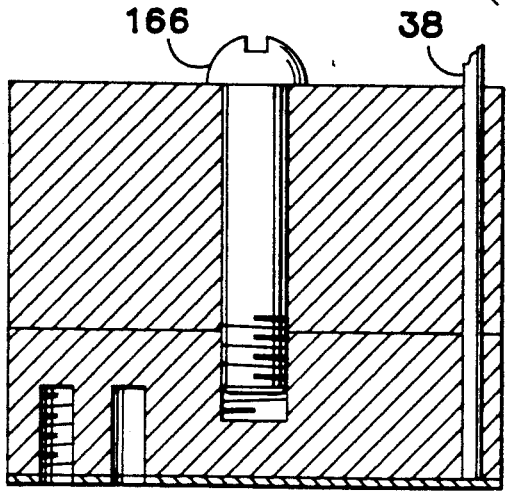
FIG. 8 is a sectional view of the FIG. 7 alignment block when assembled.

It is preferred that the alignment block be in two parts, namely a cable alignment block 160 and a pin alignment block 162 as shown in FIGS. 7 and 8. The cable alignment block is attached to the coaxial cables 38 (only one of which is shown in FIGS. 7 and 8) in the manner described above, except that the cables are prepared so that the insulator layer projects from the shield by slightly more than the thickness of the pin alignment block 162, and the cables are attached to the cable alignment block 160 with the insulator layer projecting beyond the lower surface of the cable alignment block by an amount equal to the thickness of the pin alignment block. The cable alignment block has a central hole 164 for receiving a screw 166 (FIG. 8), and the pin alignment block has a central internally threaded hole 168 for receiving the screw. When the cables have been attached to the cable alignment block and their ends project therefrom, the pin alignment block 162 is fitted over the projecting ends of the cables and is secured to the cable alignment block 160 using the screw 166, which is tightened by means of a tool inserted through the funnel 14 and the tube 10. The circuit board 78 is fitted over the projecting ends of the center conductors and is attached thereto in the manner described above. By removing the screw 166 and applying heat to the solder joints that connect the circuit board 78 to the center conductors of the cables, the circuit board can be removed without disturbing the attachment of the cables to the cable alignment block 160.

It will be appreciated that the invention is not restricted to the particular embodiment that has been described, and that variations may be made therein without departing from the scope of the invention as defined in the appended claims and equivalents thereof.

We claim:

1. Probe apparatus for testing an electronic circuit at a cryogenic temperature by immersion in a liquid cryogen contained in a vessel having a substantially circular flange surrounding an opening that gives access to the interior of the vessel, said probe apparatus comprising:

a mounting tube having two opposite ends, a mechanical holder for receiving a device under test and an etched circuit board probe and holding them in predetermined relative positions at one end of the mounting tube, interior means attached to the mounting tube at the opposite end thereof for sealing the interior of the tube from ambient atmosphere and having terminals for connecting to an external test and measurement instrument, signal transmission means extending within the mounting tube from the interface means to the mechanical holder for transmitting electrical signals between the etched circuit board probe and said terminals, and a bushing member attached to and surrounding the mounting tube for engaging in sealing fashion the flange of the vessel containing liquid cryogen.

2. Probe apparatus according to claim 1, wherein the mechanical holder comprises an alignment member having a main surface against which the probe is positioned, a chip receiver for receiving an electronic circuit under test, and attachment means for attaching the chip receiver to the alignment member so that the circuit under test is presented to the probe.

3. Apparatus according to claim 2, wherein the signal transmission means comprise multiple coaxial cables and the alignment member comprises an alignment block having multiple bores that open at the main surface of the alignment block and within which the coaxial cables extend respectively.

4. Apparatus according to claim 3, wherein each coaxial cable comprises a center conductor, an insulating layer and an outer shield, the outer shield is attached to the alignment block, and the center conductor is attached to the probe, whereby the probe is held against movement relative to the alignment block.

5. Apparatus according to claim 2, wherein the signal transmission means comprise multiple coaxial cables, each having a center conductor, an insulating layer and outer shield, and the alignment member comprises a cable alignment block formed with multiple bores through which the coaxial cables respectively extend, the shields of the coaxial cables being bonded to the cable alignment block, a pin alignment block formed with multiple bores through which the cables respectively extend, and means attaching the pin alignment block to the cable alignment block.

6. Apparatus according to claim 5, wherein the pin alignment block has a first main face against which the probe is positioned and a second main face that confronts the cable alignment block, and the center conductors of the coaxial cables project beyond the first main face of the pin alignment block and pass through the probe and are attached to the probe.

7. Apparatus according to claim 2, wherein the alignment member includes alignment elements, the chip receiver has a main surface and includes alignment elements that are complementary to the alignment elements of the alignment member, the chip receiver defines a cavity that opens at its main surface, and the attachment means attach the chip receiver to the alignment member with the main surface of the chip receiver in confronting relationship with the main surface of the alignment member and with the alignment elements of the chip receiver in registration with the alignment elements of the alignment member.

8. Apparatus according to claim 7, wherein the chip receiver defines a cavity that opens at its main surface and the mechanical holder further comprises a pusher block fitted in the cavity of the chip receiver in a manner permitting translation perpendicular to the main surface of the chip receiver for pushing an electronic circuit under test into contact with the probe, and a resiliently yieldable means for urging the pusher block towards the alignment member when the chip receiver is attached to the alignment member.

9. Apparatus according to claim 8, wherein the pusher block is fitted in the cavity of the chip receiver in a manner permitting limited tilting movement of the pusher block in the cavity about at least one axis parallel to the main surface of the chip receiver.

10. Apparatus according to claim 8, wherein the mechanical holder further comprises a screw in threaded engagement with the chip receiver, and wherein the resiliently yieldable means comprise a compression spring fitted on the screw and a seat member disposed between the pusher block and the spring.

11. Apparatus according to claim 8, wherein the pusher block has a generally planar surface that confronts the main surface of the alignment member when the chip receiver is attached to the alignment member and includes locating portions upstanding from said generally planar surface defining a recess for receiving the circuit under test.

12. Apparatus according to claim 1, wherein the interface means comprise a sealing plate attached to the mounting tube at said opposite end thereof and an annular connector carrier disposed between said sealing plate and said opposite end of the mounting tube.

13. Apparatus according to claim 1, wherein the mounting tube comprises a first segment having a greater diameter end and a smaller diameter end, and a second segment of substantially uniform diameter connected to said first segment at said smaller diameter end thereof, and wherein the greater diameter end of said first segment constitutes said opposite end of the mounting tube.

14. Apparatus according to claim 13, wherein the first segment of the mounting tube comprises a funnel portion and a neck portion, said neck portion being of substantially uniform diameter, said second segment is of substantial uniform diameter and is connected to said neck portion at an end thereof that is distal from said funnel portion, and said bushing member surrounds said neck portion of said first segment of the mounting tube.

* * * * *